United States Patent [19]

Flannery

[11] 4,270,186
[45] May 26, 1981

[54] MULTIPLE GENERATOR BLOCK REPLICATE BUBBLE MEMORY DEVICE

[75] Inventor: William E. Flannery, Norristown, Pa.

[73] Assignee: Sperry Corporation, New York, N.Y.

[21] Appl. No.: 44,278

[22] Filed: May 31, 1979

[51] Int. Cl.³ .............................................. G11C 19/08
[52] U.S. Cl. ........................................ 365/15; 365/12
[58] Field of Search ............................. 365/15, 16, 12

[56] References Cited

U.S. PATENT DOCUMENTS

| | | | |
|---|---|---|---|
| 4,073,012 | 2/1978 | Ohnigian | 365/15 |
| 4,168,535 | 9/1979 | Belser | 365/15 |

*Primary Examiner*—James W. Moffitt

*Attorney, Agent, or Firm*—John B. Sowell; William E. Cleaver; Marshall M. Truex

[57] ABSTRACT

A block replicate bubble memory device is provided with a plurality of series storage loops, wherein data words are written into or read out of the storage loops in parallel. The data is entered into write lines and is read on to read lines which are connected to the series storage loops approximately one-half of one loop time apart. Information in the storage loops is ordinarily changed or altered in no less than one-half of one loop time in the prior art. The present invention provides a plurality of bubble generators connected to the serial write line in a manner which permits several bubble device functions to be conducted in less than one-half of one loop time.

8 Claims, 3 Drawing Figures

MULTIPLE GENERATOR BLOCK REPLICATE BUBBLE MEMORY DEVICE

BACKGROUND OF THE INVENTION

1. Field of the Invention

The present invention is related to bubble memory devices. More particularly, the present invention is related to the provision of a plurality of bubble generators connected to the serial write line. The generators are selectively activatable so as to reduce the access time for up dating or changing data in the serial loops of a block replicate bubble memory.

2. Description of the Prior Art

Prior art bubble memory devices have been generally classified in the U.S. Patent Office in U.S. Class 365, subclasses 1 to 44 (International Class G11C 11/14 to 19/08).

While prior art bubble memory devices have employed various sizes and arrangements of storage patterns, the present invention is particularly well suited for use with large capacity bubble memory chips which employ a plurality of large storage loops in which the bubble domains are stored in serial form. Each storage loop is preferably provided with a read port and a write port separated from each other by a distance of one-half of one loop time.

A block replicate bubble memory device having large storage loops is described by P. I. Bonyhard and J. L. Smith of Bell Laboratories in the IEEE Transactions on Magnetics, Volumn MAG 12, No. 6 (pp 614–617) December 1976.

This Bell Laboratories' article describes a 64,000 bit magnetic bubble chip having 131 storage loops of 523 bits each. Each loop is connected at its turn-around points or ends to a write major line and to a read major line. Even though this publication employs odd and even groups of storage bits and duplicates major read and write lines, the write major lines serve to supply a single bit of data to each of the connected loops in parallel fashion when information is written into the loops. Similarly, the read major lines serve to receive a single bit of data from each of the connected storage loops in parallel fashion when information is read out of the storage loops. The write major line is located one-half of one loop time away from the read major line, and the generator is located one-half of one loop time from the entry gate of the storage loop farthest from the generator. This reference also describes controlled pulses which are employed to generate bubbles, replicate or annihilate bubbles during write-transfer-in and read-transfer-out. The pulse amplitudes required to generator a bubble domain are shown to be approximately four times the amplitude required to transfer the domain from the storage loop or to transfer the bubble domain out of the storage loop.

According to this teaching, bubble domains may be transfered-out at the read-out ports so that these bubble domain positions in the storage loops are effectively cleared or emptied leaving the equivalent of a zero bit stored therein. In order to write into the storage loops, bubble positions must be first cleared using the read-out-annihilate logic, then the bubble positions cleared at the read-out ports are propagated to the write-in ports. In order to effectively coordinate the arrival of the newly generated bubble at the write-in ports, the buble generator is located one-half of one loop time distance from the furtherest storage loop. The bubbles being generated are representative of new data and are propagated in series fashion on the write major line until a complete serial word is in position opposite all of the read-in ports of the serial storage loops. Accordingly, the control logic assures that a cleared position in the storage loops is positioned opposite the write-in port when the word (or bit) in the write major line is ready to be transferred into the plural storage loops.

It will be recognized that the generated bubble and the annihilated bubble positions are propagated from bit position to bit position by the same rotating field. Thus, the generator must be located one-half of one storage loop bit time in distance from the first newly generated bit to arrive at the furtherest write-port connected to the write major line.

In most large scale bubble chips, the number of bits in each loop exceeds the number of loops by a factor of four or more, accordingly, a portion of the write major line serves as a delay line for delaying the bits being generated and propagated to the furtherest storage loop from the generator.

When it is desirable to change data in the storage loops, a simultaneous read-write operation is executed. Bubbles at the read-out port are destroyed and new bubble data is generated at the bubble generator and fed onto the write major line. Once the write major line is filled, the new data bubbles may be passed through the respective write-in ports to supply one new bit to each of the storage loops. This process must be repeated to generate another new bit for each of the storage loops. Thus, it will be understood that the major lines contain words and the serial storage loops contain one bit of each word. Accordingly, there is a time requirement equivalent to one-half of one loop time to enter each new bit into a storage loop. For purposes of this invention, one-half of one loop time shall be defined as the time required for the rotating field to propagate a bubble domain from a read port to a write port.

Further, one bit time is herein defined as the time required to propagate a bubble domain from one position in a storage loop, or a major line, to an adjacent bit position.

It would be desirable to be able to up-date information in the storage loops of a bubble chip faster than has been accomplished in the past. further, it would be desirable to be able to examine the data representative of a bubble domain in the storage loops before having to generate a new bubble domain for insertion in the storage loop.

SUMMARY OF THE INVENTION

It is a principal object of the present invention to provide a faster access bubble memory device.

It is another object of the present invention to provide a plurality of bubble domain generators for each of said storage loops.

It is another object of the present invention to provide a new function which will permit the control circuits to sequentially read, display and then write in new data in a bubble memory device.

It is a further object of the present invention to provide a faster read, modify and write mode which is particularly useful for a plurality of bubble memory devices which require a deskewing operation.

It is another object of the present invention to eliminate the need for a replicate mode during a read-out operation.

According to these and other objects of the present invention to be discussed in greater detail hereinafter, there is provided a block replicate bubble memory chip having a plurality of bubble domain generators connected to the write major line at different bit time distances from the storage loops which are selectively activatable to decrease access time.

BRIEF DESCRIPTION OF THE DRAWINGS

The foregoing objects and advantages of the novel bubble memory device and its mode of operation will be made apparent from the detailed description of the accompanying drawings in which.

DESCRIPTION OF THE PREFERRED EMBODIMENT

Figure 1:
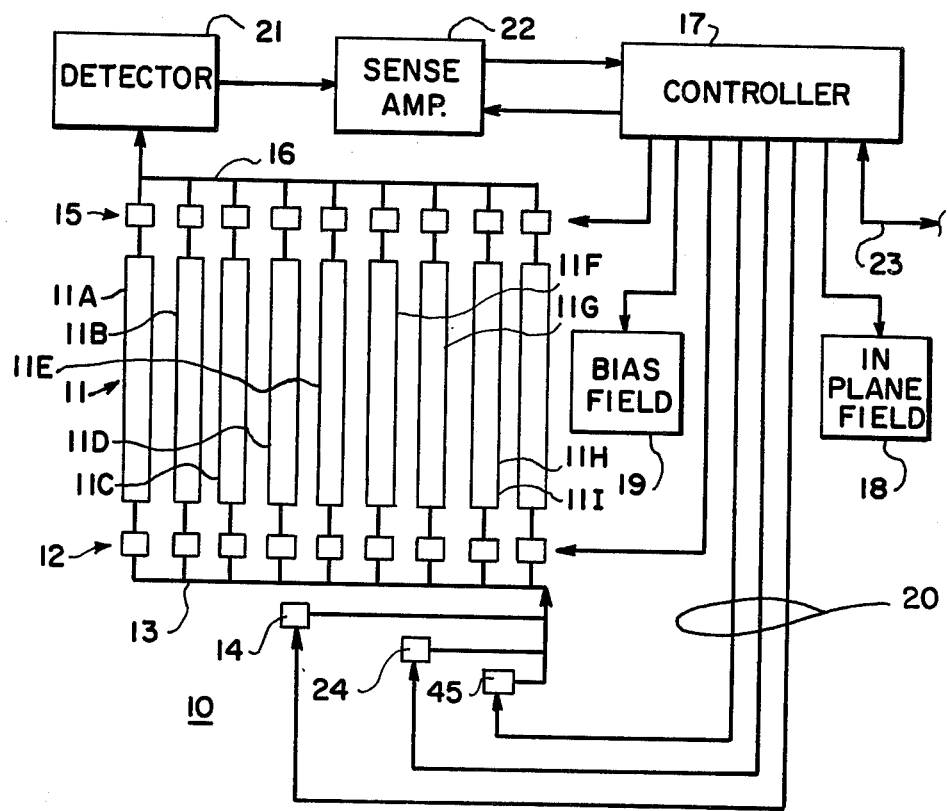
FIG. 1 is a schematic block diagram of a bubble memory device incorporated into the present invention bubble memory system.

FIG. 1 shows a schematic block diagram of interconnected elements employed in an operable bubble memory system 10. The system 10 comprises a plurality of storage loops 11A to 11I. Each storage loop 11 is serial in nature forming a closed propagation path for bubble domains stored therein. At the lower end of the loops 11 there is provided a write-in port 12 (including input gates) for each loop which is connected between the loop turn-around points and the write major line 13. The write major line 13 is of known construction and it provides a serial propagation path for bubble domains being generated at bubble generator 14. As has been explained hereinbefore, generator 14 is located approximately one-half of one loop time from storage loop 11A. At the upper end of the storage loops 11 there is provided a read-out port 15 (including output gates) associated with each loop which is connected between a loop turn-around points and a read major line 16.

When the operation known as simultaneous-read-write operation is performed, controller 17 is programed to transfer the bubble domains out of the loops which clears the binary bits in the upper end of the storage loop at the same time as new data bits are being generated at bubble generator 14. The series of bubble domain bits are generated and propagated in serial fashion onto write major line 13. When the cleared bubble position in the storage loop is propagated from the upper turn around point to the lower turn around point one-half of one loop time has taken place. When the cleared position in the serial loops 11 is at the write-in ports 12, information can be written into the storage loops 11. The propagation of the bubble domains on the write major line 13 is predetermined so that the word on line 13 is in parallel format opposite the write-in ports 12 when the cleared bubble positions are opposite the write in ports 12. A signal generated by controller 17 causes the bubbles on the write major line 13 to be transferred through the write-in ports 12 in parallel, thus, clearing the write major line 13. It will be understood that the rotating in-plane field 18 and the bias field 19 are continuously applied while this operation is taking place.

Only one bubble was written into each of the storage loops 11 during approximately one-half of one loop time. In order to write in another word consisting of a plurality of bubbles it is necessary to repeat the whole sequence of operations.

When information in the storage loops 11 is to be read or examined, the information is transferred through the read-out ports 15. In the present invention it will be assumed that the read-out ports may comprise block replicate read-out ports wherein the bubble opposite the read-out port may be elongated and split or replicated so that the data in the storage loop is not cleared and a representation of the bubble is also provided in the read major line 16. The word being read onto line 16 is transferred in parallel from the storage loops 11 and propagated through the detector 21 where it is destroyed. The serial bits of the word are sensed in a sense amplifier 22 of any of the known types and may be displayed at the controller 17 or transferred to a remote display such as a central processing unit (not shown) via line 23.

In prior art large capacity block replicate bubble memory systems the detector 21 has been placed closer to the storage loops than the bubble generator 14. Accordingly, it was possible to non-destructively examine a word in the storage loops 11 in less than one-half of one loop time. If the information being read or examined indicated a need for a change or an up-date of the information, the bubble representative of the data to be changed or up-dated would have to be propagated back to the read-out ports 15 to be cleared. The present invention eliminates the delay in making a correction or up-date of information in the storage loops.

In the present invention, to up-date information, detector 21 is placed as close as possible to the storage loops 11. The information to be examined or modified is read out of the storage loops so as to clear the bubble position in the storage loops. The bubble domains are passed through the detector 21 where they are destroyed after being sensed and stored in controller 17. The information may be compared with information in the controller 17 or may be compared or up-dated by a central processing unit (not shown) via line 23. Since the central processing unit is very fast compared to the speed of one bit time or one cycle of the in-plane rotating field 18, numerous computations and comparisons can be made before the controller 17 must initiate or start the generation of a bubble at generator 24 via control line 20. Accordingly, there is no real need to move generator 24 more than two bit times closer to the storage loop 11 than the detector 21 is removed from the storage loops 11.

Having explained how bubble generator 24 may be employed to reduce access time when up-dating or altering information in storage loops 11, it will be understood that the cleared bubble position in the storage loops 11 is being moved from the read-out ports 15 toward the write-in ports 12 while the word on line 16 is being propagated through the detector 21. After the word is examined and a decision regarding up-dating the information is made, the bubble position to be altered may have moved halfway toward the write-in ports 12. By moving bubble generator 24 closer to the storage loops 11 by the same distance that the bubble postion has moved in the storage loops information written by bubble generator 14 will arrive on the write major line 13 at the proper synchronized time to be read into the cleared bubble positions.

If the pattern and size of the storage loops 11 permit, the bubble generator 24 may be moved even closer to the storage loops 11 because the controller 17 is capable of keeping track of the position of the cleared bit in the loops 11 and is also capable of initiating the generation of the new word so as to synchronize the arrival of the new word at the write-in ports 12 with the arrival of the cleared bit position at the write-in ports 12.

Since bubble generator 24 is closer to the storage loops 11 by a distance approximately equal to the time required for the information read out of the read-out ports 15 to be processed and received at controller 17, there is no real need for generator 14. Generator 14 was explained as having been located approximately one-half of one loop time from the storage loops 11 as employed in prior art devices. The most frequent employed operation of a bubble memory is the read operation. The present invention permits the destruction of the bubble positions during the read operation and permits subsequent write in without loss of time or loss of data. In bubble memories, replication of the bubble domains requires a more complex gating structure as well as a multi-level power supply to produce a complex replicate pulse. Provision of the bubble generator 24 closer to the storage loops 11 dispenses with the need for a complex replicate function.

Figure 2:
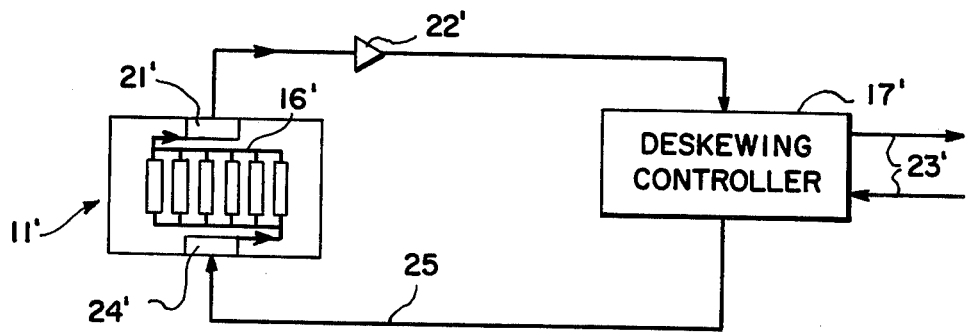
FIG. 2 is a schematic block diagram showing a bubble memory device connected to a simplified deskewing controller.

Another feature of the present invention may be explained with reference to FIG. 1 and 2 showing bubble generator 24. Most bubble memory devices 10 are imperfect. When a large number of storage loops 11 are provided on a chip or device, several of the storage loops are found to be imperfect and not suitable for storing bubble domains. it has become acceptable commerical practice to bypass the use of the faulty storage loops 11. Different methods have been proposed and the most common method is to acknowledge that the bad storage loops present problems and avoid storing bubble domains in the bad loops. In order to facilitate the bypassing of the bad storage loops the word prepared for write-in on write major line 13 must be spaced out and additional redundant storage loops 11 provided to take the place of the bad loops. Further, the word read-out of the storage loops 11 onto the read major line 16 is spaced out and must be reconformed to a regular data word in order to facilitate proper use. When a single chip or device is involved, the problem is resolved relatively simply by providing a ROM memory and a controller 17 in which is stored the information identifying the useable storage loops 11.

In FIG. 2, information supplied on line 25 has been spaced out by controller 17' so that no data is stored in a bad storage loop 11'. Spaced out information stored in storage loops 11' is read onto read major line 16', detected at detector 21' and processed at sense amplifier 22' before being stored in deskewing controller 17'. The information may be processed in controller 17 or transmitted to an external computer or piece of utilization equipment via lines 23'.

In most bubble memory systems there is more than one chip or bubble device arranged in an array which requires the use of a plurality of chips to form a data word. Since none of the chips have identical location of bad loops 11', the partial words stored in the individual chips have a different skewing pattern which must be corrected. For the information stored in the plurality of chips to be used together, the information must be deskewed for use together and skewed again if the same information is to be stored in the storage loops.

Figure 3:
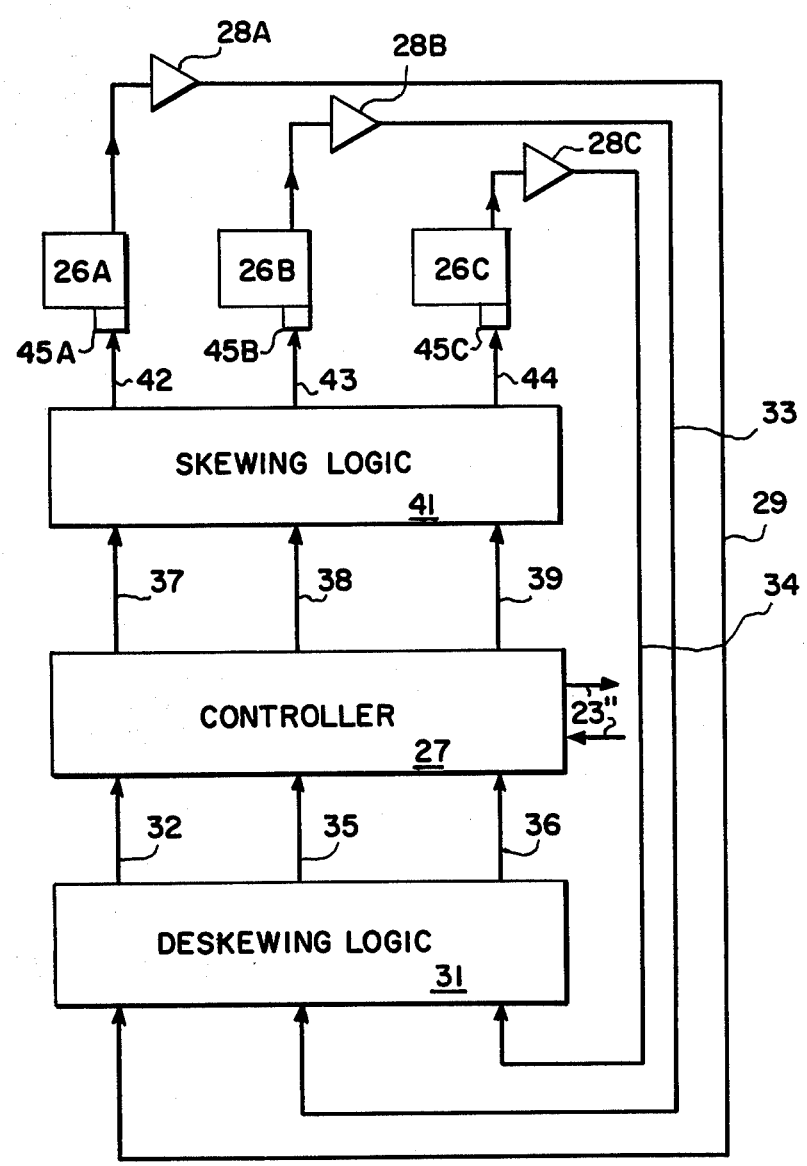
FIG. 3 is a schematic logic block diagram showing how a plurality of the novel bubble memory devices may be incorporated into a bubble memory system.

Refer now to FIG. 3 showing the bubble memory devices 26A, 26B and 26C arranged in parallel array. Assume that a read operation is to be performed and the information in devices 26A, 26B and 26C is to be read-out in parallel to form a complete word. As explained above, the information being read-out of these chips has imperfect loops and the deskewing pattern for the different chips is also different. A ROM memory is located in controller 27 which keeps track of the good storage loops, and thus comprises a deskewing and skewing pattern. It will be understood that the same rotating field and in-plane field is effective for propagating the bubbles in the chips 26. The partial word read from chip 26A is detected by a detector not shown and processed by sense amplifier 28A. The partial word is propagated on line 29 to deskewing logic 31 under the control of controller 27. The spaced out partial word is conformed in deskewing logic 31 to present a partial useful word which is transmitted on line 32 to controller 27. In similar manner, chips 26B and 26C provide spaced out partial words which are processed through sensed amplifiers 28B and 28C and propagated on lines 33 and 34 to deskewing logic 31. The spaced out partial words are processed in deskewing logic 31 where they are conformed to useable partial words and transmitted on lines 35 and 36 to controller 27. It will be understood that the partial words on lines 32, 35 and 36 are arriving simultaneously in a conformed pattern to controller 27 where they may be used or transmitted via lines 23" to a computer or a utilization piece of equipment. After the information is used at controller 27, it is necessary for the information to be spaced out again in a proper pattern so that it is skewed and may be written into the individual chips 26A, 26B and 26C. The conformed words are presented on lines 37, 38 and 39 to the skewing logic 41. The skewing logic under control of controller 27 spaces out the words in a pattern which avoids the aforementioned bad loops in chips 26A, 26B and 26C. The spaced out information on lines 42, 43 and 44 is presented to generators 45A, 45B and 45C so that the skewed words are properly stored in the storage loops of the chips 26.

Generators 45A, 45B and 45C are shown as generator 45 in FIG. 1. This generator 45 is placed closer to the storage loops 11 by approximately two or three bit times. It has been found that two or three bit times is sufficient bit time for controller 27, deskewing logic 31 and skewing logic 41 to perform their proper functions. Having explained how the skewing logic 41 and deskewing logic 31 perform their functions, it will be understood that the skewing logic and deskewing logic functions may be placed within the controller 27. By placing the generator 45 closer to the storage loops 11 than generator 24 there is no loss in access time in performing the skewing and deskewing operation.

I claim:

1. A block replicate bubble memory device comprising:
   a plurality of serial storage loops each having an input and an output gate,
   a write port for each storage loop connected to said input gates,
   a read port for each storage loop connected to said output gates,
   a serial write line connected to said write ports and adapted to provide data in parallel format to said storage loops simultaneously, a first bubble generator connected to said serial write line and adapted to write data thereon in serial format, a serial read line connected to said read ports and adapted to receive data in parallel format from said storage loops simultaneously, and a bubble detector connected to said serial write line, said bubble detector being connected on said serial read line substantially less than one-half of the storage loop time away from said storage loops, and said first bubble generator being connected to said serial write line at a bit time distance away from said storage loops which is approximately equal to one-half of a storage loop time less the bit time distance said detector is removed from said storage loops, whereby bubbles being destroyed at said detector may be replaced after being sensed in less than one-half of one storage loop time.

2. A block replicate bubble memory device as set forth in claim 1 wherein there is further provided a second bubble generator connected to said serial write line at a bit time distance away from said storage loops which is approximately equal to one-half of one loop time.

3. A block replicate bubble memory device as set forth in claim 1 which further includes an auxiliary bubble generator connected to said serial write line at a time position which is closer than said first bubble generator.

4. A bit replicate buble memory device as set forth in claim 3 wherein there is further provided control line means for each of said bubble generators for selectively activating one of said bubble generators.

5. Is a block replicate bubble memory device as set forth in claim 3 wherein one of said auxiliary bubble generators is connected to said serial write line within a small number of bit time distances of said first bubble generator.

6. A block replicate bubble memory device as set forth in claim 3 wherein only one of said bubble generators is selectively activatable and the other bubble generators are disconnected from said bubble chip circuit.

7. A block replicate bubble memory device as set forth in claim 3 which further includes:

a plurality of different redundant memory devices, deskewing logic means for arranging skewed data words from said different memory devices into comparable format, and skewing logic means for rearranging comparable format words into skewed data words for storage into said different redundant memory devices.

8. A block replicate bubble memory device as set forth in claim 7 wherein said deskewing and skewing logic means comprise part of said controller.

* * * * *